(12) United States Patent
Ogawa

(10) Patent No.: US 12,484,433 B2
(45) Date of Patent: Nov. 25, 2025

(54) METHOD OF MANUFACTURING A DISPLAY DEVICE IN WHICH A PARTITION IS ARRANGED ON A BOUNDARY BETWEEN ADJACENT SUB-PIXELS

(71) Applicant: Magnolia White Corporation, Tokyo (JP)

(72) Inventor: Hiroshi Ogawa, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 416 days.

(21) Appl. No.: 18/159,087

(22) Filed: Jan. 25, 2023

(65) Prior Publication Data

US 2023/0240125 A1 Jul. 27, 2023

(30) Foreign Application Priority Data

Jan. 27, 2022 (JP) .................. 2022-011095

(51) Int. Cl.
*H10K 71/20* (2023.01)
*H10K 59/12* (2023.01)

(52) U.S. Cl.
CPC ....... *H10K 71/231* (2023.02); *H10K 59/1201* (2023.02)

(58) Field of Classification Search
CPC .. H10K 71/231; H10K 59/1201; H10K 50/00; H10K 50/818; H10K 59/00; H10K 59/122; H10K 59/173; H10K 71/00; H01L 21/3213
See application file for complete search history.

(56) References Cited

U.S. PATENT DOCUMENTS

| 2004/0160170 A1 | 8/2004 | Sato et al. |
| 2009/0009069 A1 | 1/2009 | Takata |
| 2011/0241027 A1* | 10/2011 | Kaneta ................... H10K 50/17 438/22 |
| 2019/0363275 A1 | 11/2019 | Ochi et al. |
| 2021/0320277 A1* | 10/2021 | Wang ................. H10K 59/1315 |
| 2023/0240117 A1* | 7/2023 | Fukuda .............. H10K 59/8721 257/40 |
| 2023/0255063 A1* | 8/2023 | Fukuda ................ H10K 59/122 257/40 |

FOREIGN PATENT DOCUMENTS

| JP | 2000-195677 A | 7/2000 |
| JP | 2004-207217 A | 7/2004 |
| JP | 2008-135325 A | 6/2008 |
| JP | 2009-32673 A | 2/2009 |
| JP | 2010-118191 A | 5/2010 |
| WO | 2018/179308 A1 | 10/2018 |

* cited by examiner

*Primary Examiner* — J.E. Schoenholtz
(74) *Attorney, Agent, or Firm* — XSENSUS LLP

(57) ABSTRACT

According to one embodiment, a manufacturing method is to manufacture a display device in which a partition including a lower portion and an upper portion arranged on the lower portion to protrude from a side surface of the lower portion is arranged on a boundary between adjacent sub-pixels, and the method comprises forming a metal layer above a substrate, forming the upper portion on the metal layer, reducing a thickness of a first portion of the metal layer exposed from the upper portion by anisotropic etching, and forming the lower portion by reducing a width of a second portion of the metal layer located under the upper portion by isotropic etching.

11 Claims, 10 Drawing Sheets

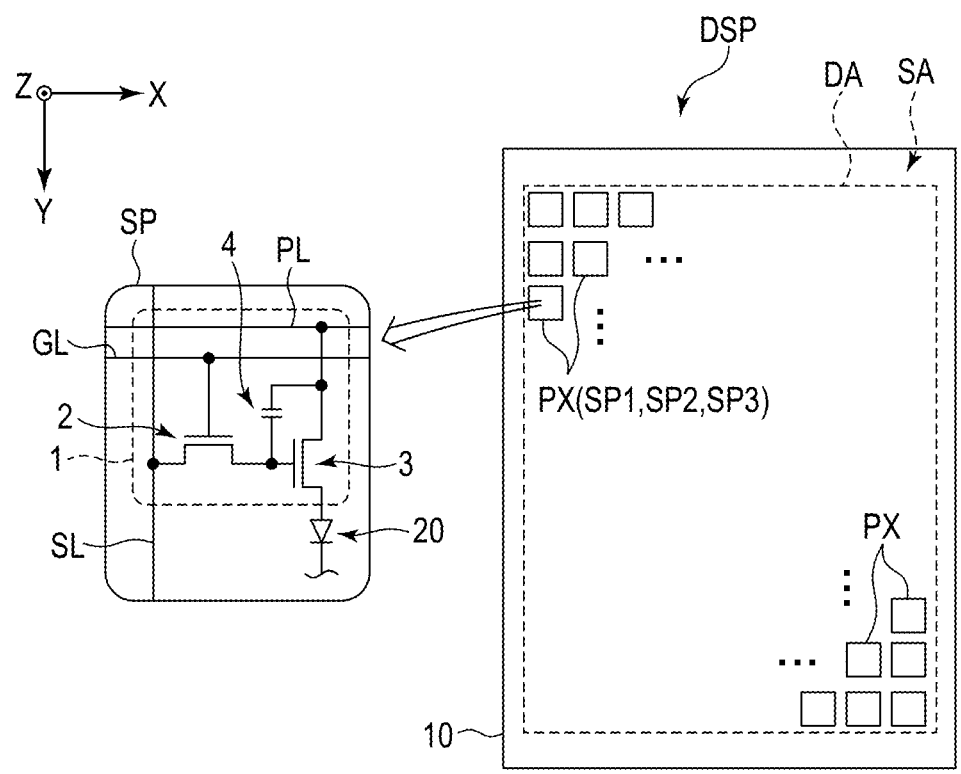
F I G. 1

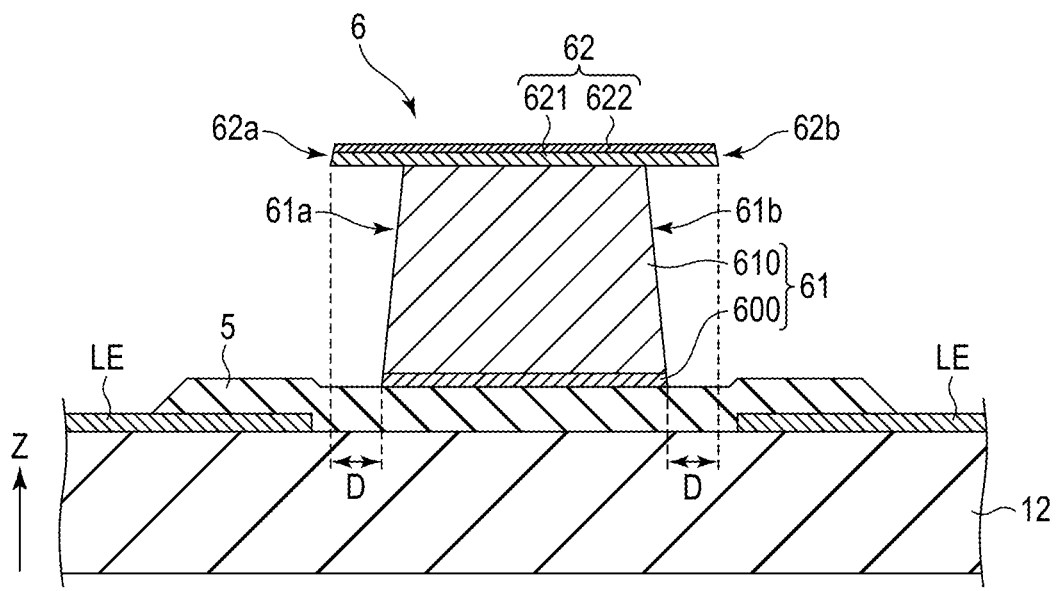
F I G. 4
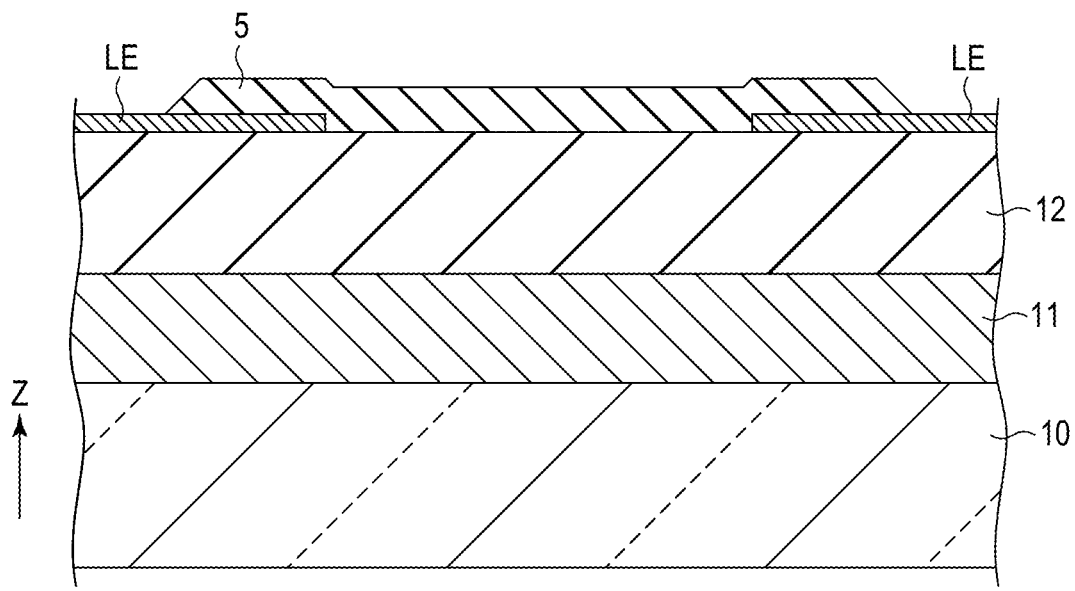
F I G. 5

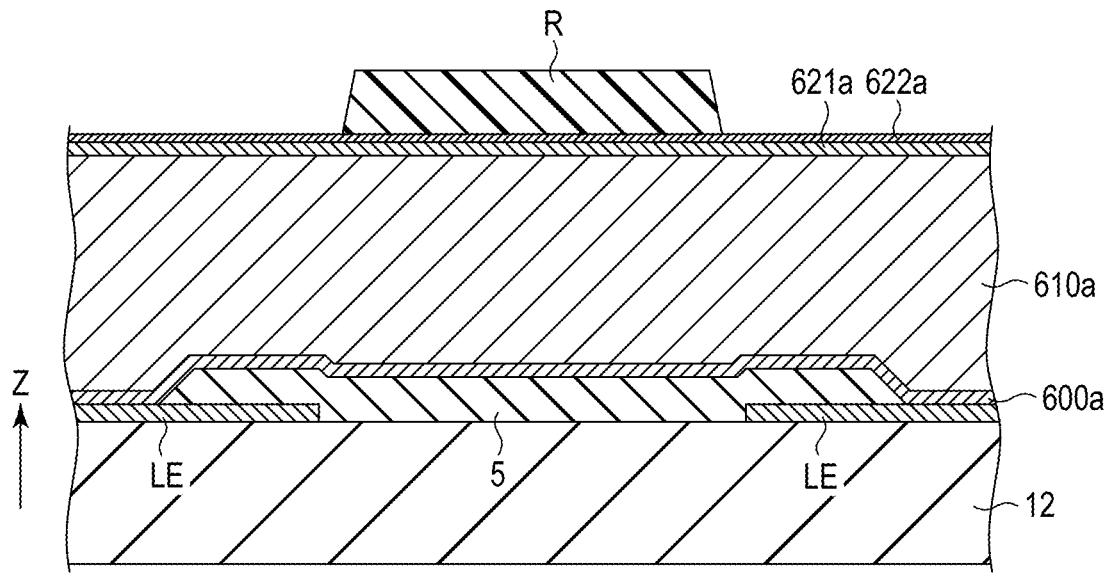
F I G. 6
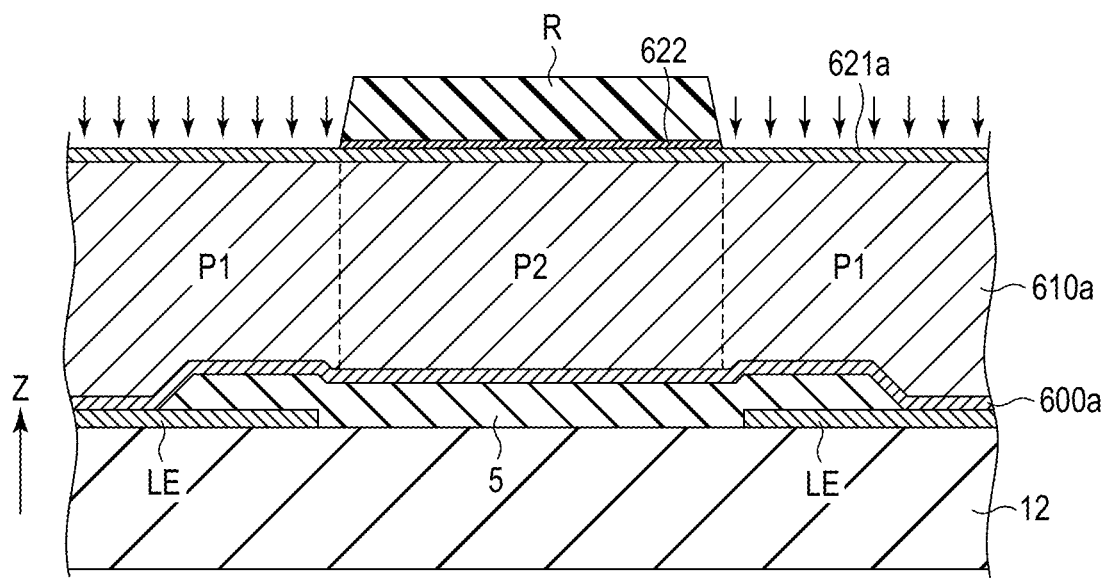
F I G. 7

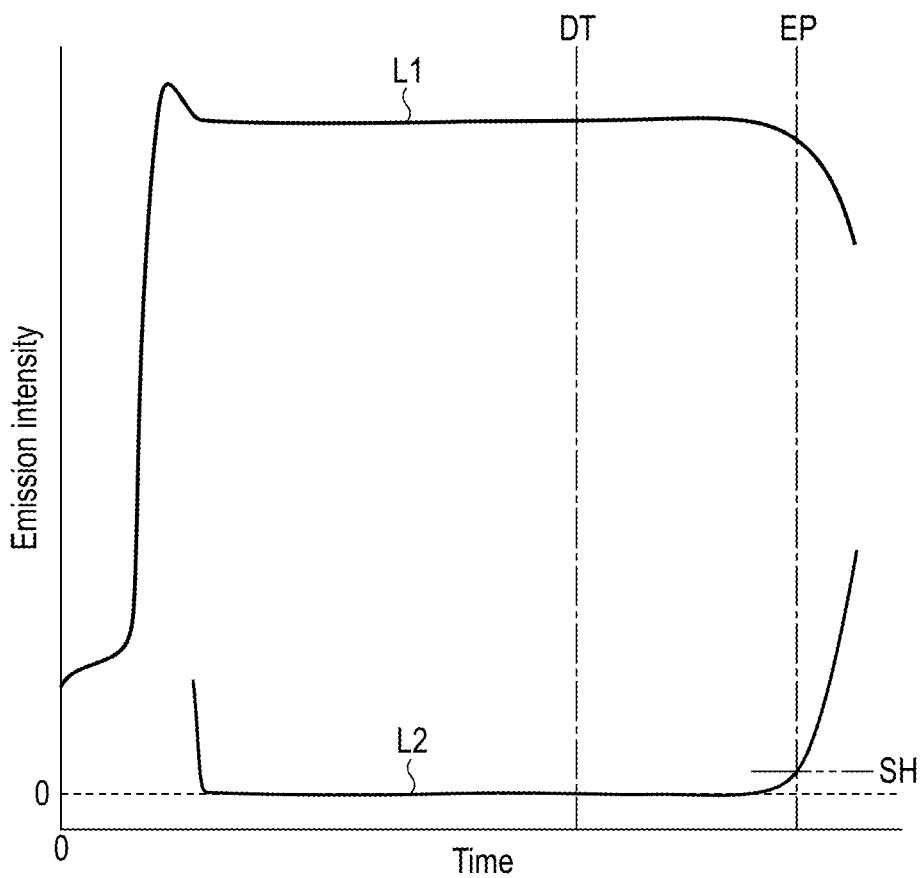
F I G. 10
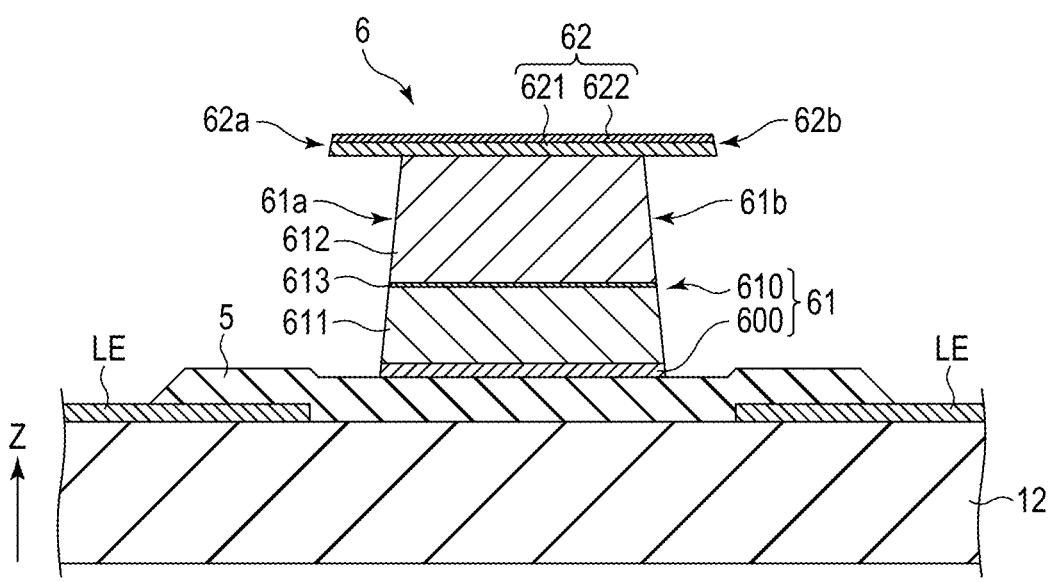
F I G. 11

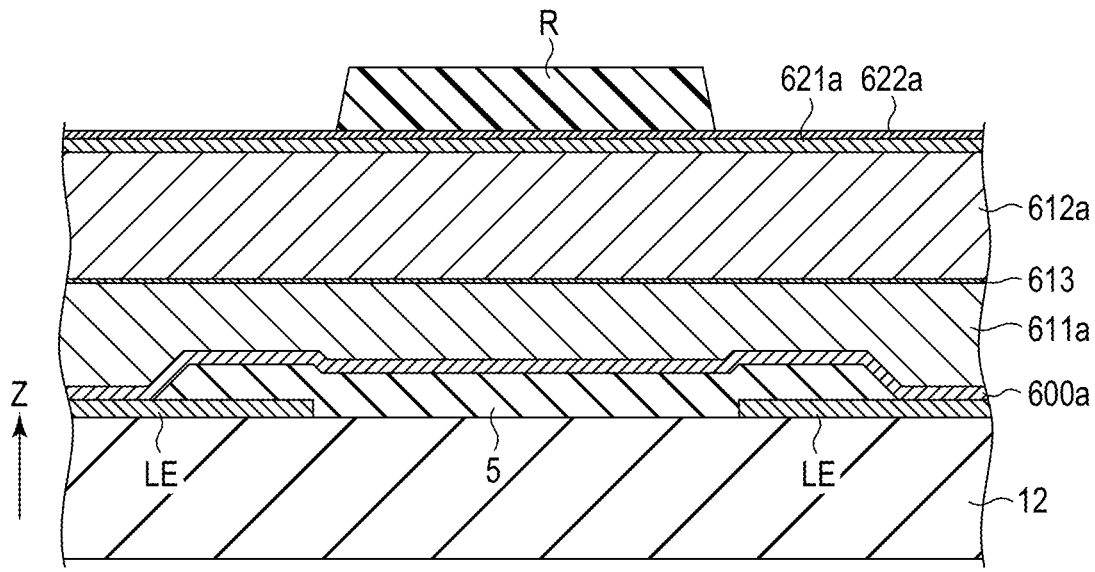
F I G. 12
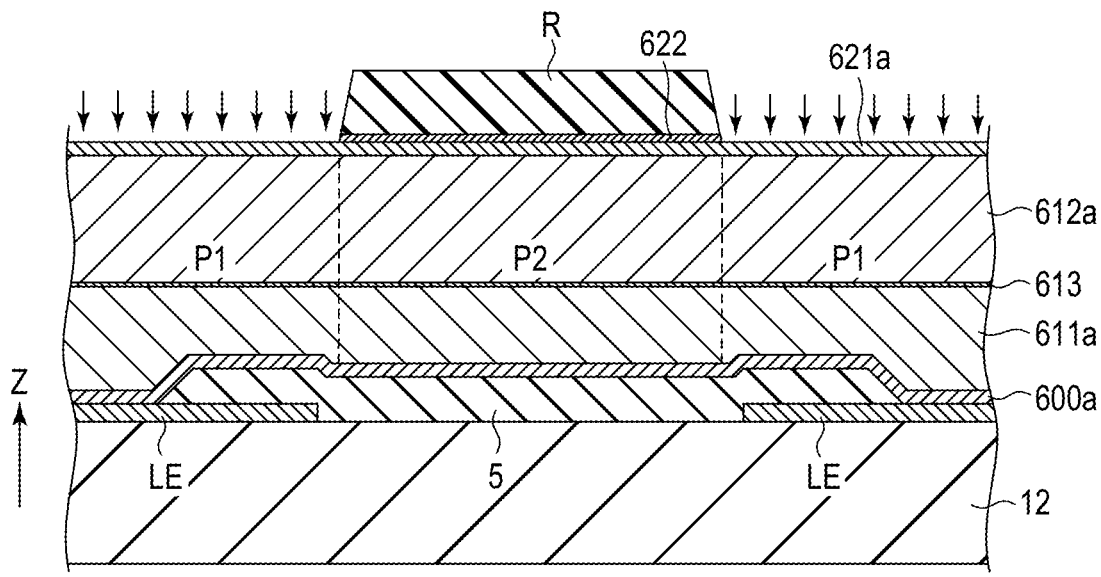
F I G. 13

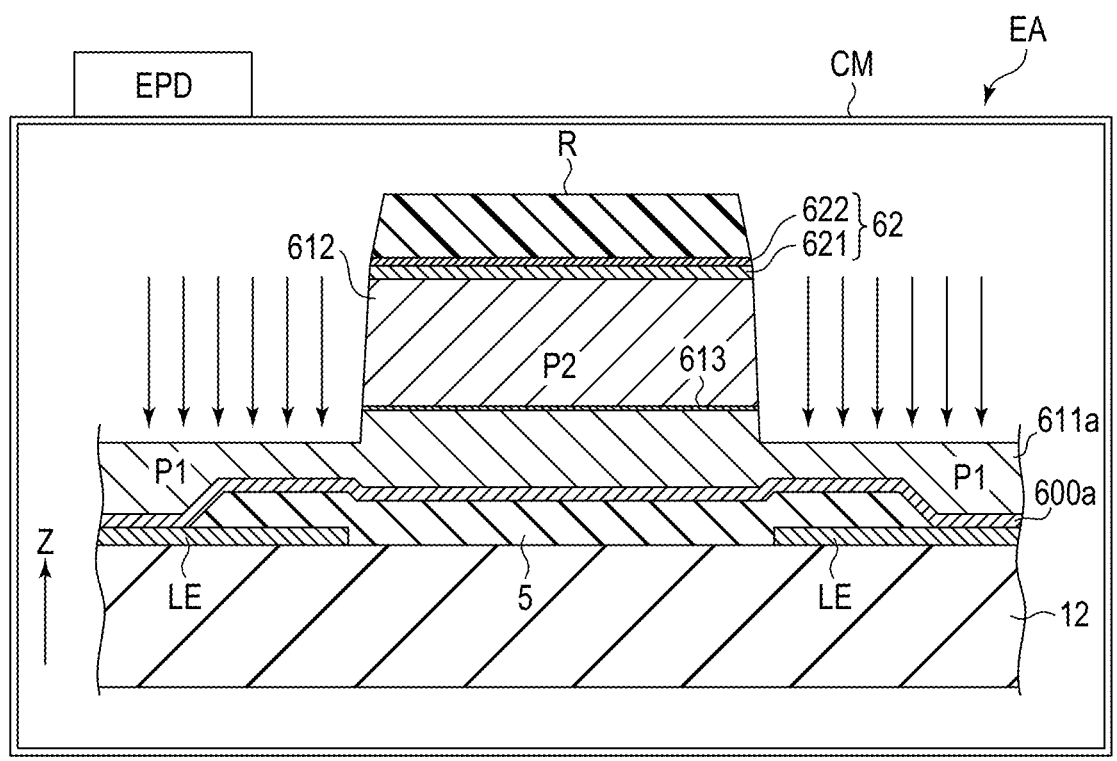
F I G. 14
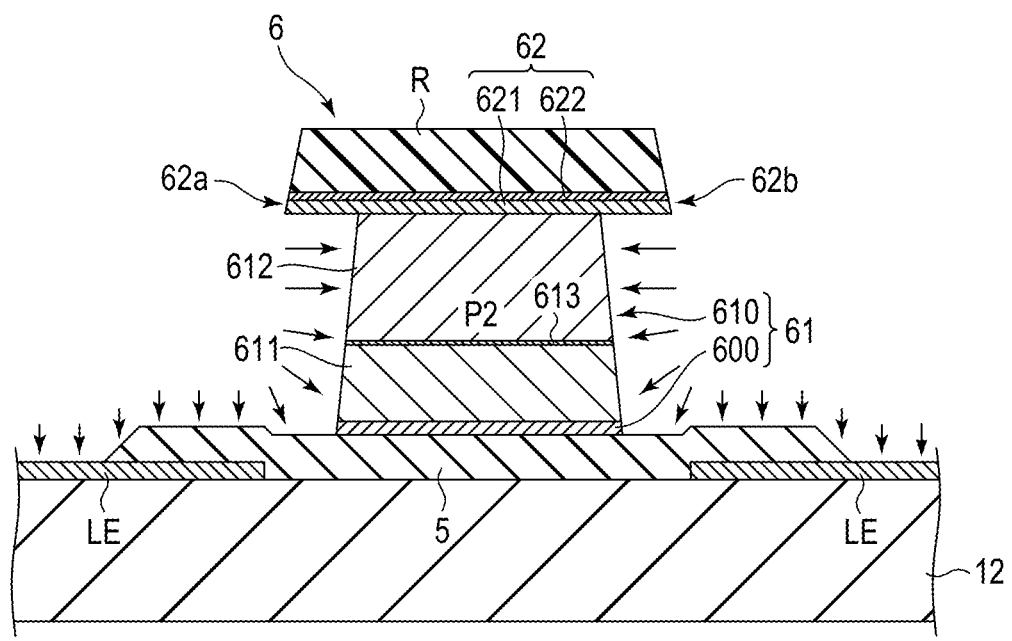
F I G. 15

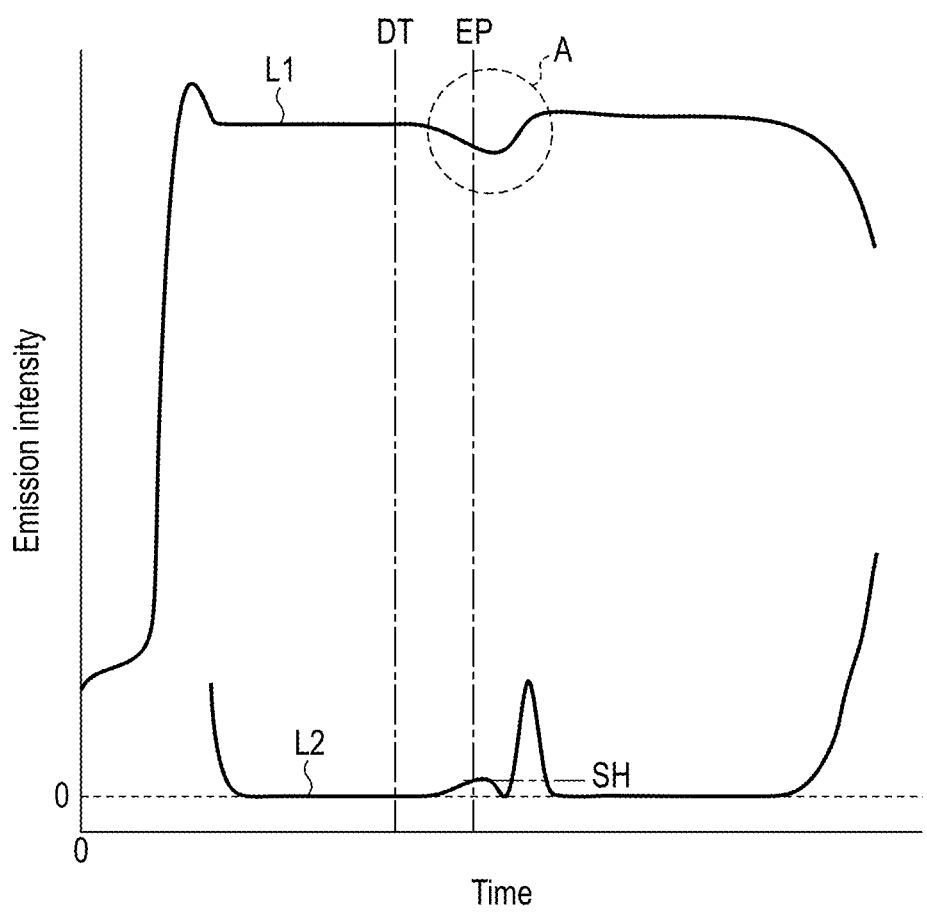
F I G. 16

METHOD OF MANUFACTURING A DISPLAY DEVICE IN WHICH A PARTITION IS ARRANGED ON A BOUNDARY BETWEEN ADJACENT SUB-PIXELS

CROSS-REFERENCE TO RELATED APPLICATIONS

This application is based upon and claims the benefit of priority from Japanese Patent Application No. 2022-011095, filed Jan. 27, 2022, the entire contents of which are incorporated herein by reference.

FIELD

Embodiments described herein relate generally to a method of manufacturing a display device.

BACKGROUND

Recently, display devices with organic light-emitting diodes (OLEDs) applied thereto as display elements have been put into practical use. This display device comprises a lower electrode, an organic layer covering the lower electrode, and an upper electrode covering the organic layer.

When the display device is manufactured, various elements are formed by etching. For this reason, improvement in display quality can be expected by enhancing accuracy in etching.

BRIEF DESCRIPTION OF THE DRAWINGS

FIG. 1 is a view showing a configuration example of a display device of a first embodiment.

FIG. 4 is a schematic, enlarged cross-sectional view showing a partition of first embodiment.

FIG. 5 is a schematic cross-sectional view showing a part of a method of manufacturing the display device of the first embodiment.

FIG. 6 is a schematic cross-sectional view showing a manufacturing process following FIG. 5.

FIG. 7 is a schematic cross-sectional view showing a manufacturing process following FIG. 6.

FIG. 10 is a graph showing an example of plasma emission intensity in anisotropic dry etching of the first embodiment.

FIG. 11 is a schematic cross-sectional view showing a partition provided in a display device of a second embodiment.

FIG. 12 is a schematic cross-sectional view showing a part of a method of manufacturing the display device of the second embodiment.

FIG. 13 is a schematic cross-sectional view showing a manufacturing process following FIG. 12.

FIG. 14 is a schematic cross-sectional view showing a manufacturing process following FIG. 13.

FIG. 15 is a schematic cross-sectional view showing a manufacturing process following FIG. 14.

FIG. 16 is a graph showing an example of plasma illumination intensity in anisotropic dry etching of the second embodiment.

DETAILED DESCRIPTION

Figure 2:
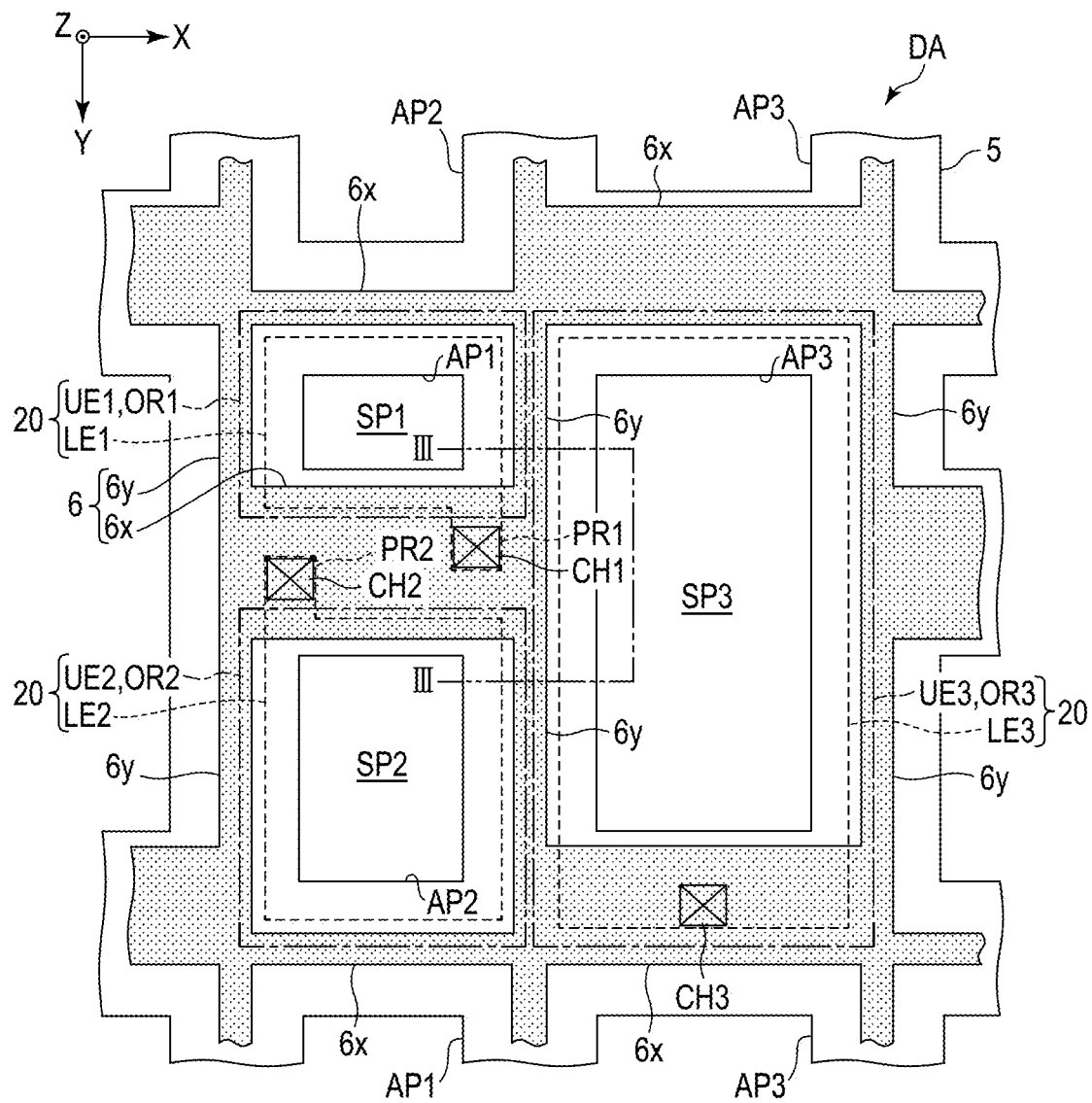
FIG. 2 is a view showing an example of layout of sub-pixels.

In general, according to one embodiment, a manufacturing method is to manufacture a display device in which a partition including a lower portion and an upper portion arranged on the lower portion to protrude from a side surface of the lower portion is arranged on a boundary between adjacent sub-pixels, and the method comprises forming a metal layer above a substrate; forming the upper portion on the metal layer; reducing a thickness of a first portion of the metal layer exposed from the upper portion by anisotropic etching; and forming the lower portion by reducing a width of a second portion of the metal layer located under the upper portion by isotropic etching.

According to this manufacturing method, accuracy in etching can be improved.

Various embodiments will be described hereinafter with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. In addition, in the specification and drawings, structural elements which function in the same or a similar manner to those described in connection with preceding drawings are denoted by like reference numbers, detailed description thereof being omitted unless necessary.

In the figures, an X-axis, a Y-axis and a Z-axis orthogonal to each other are described to facilitate understanding as needed. A direction along the X-axis is referred to as a first direction X, a direction along the Y-axis is referred to as a second direction Y, and a direction along the Z-axis is referred to as a third direction Z. Viewing various elements parallel to the third direction Z is referred to as planar view.

The display device of each of the embodiments is an organic electroluminescent display device comprising an organic light emitting diode (OLED) as a display element, and can be mounted on televisions, personal computers, vehicle-mounted devices, tablet terminals, smartphones, mobile phones, and the like.

First Embodiment

FIG. 1 is a view showing a configuration example of a display device DSP of the embodiment. The display device DSP has a display area DA where images are displayed and a surrounding area SA around the display area DA, on an insulating substrate 10. The substrate 10 may be glass or a flexible resin film.

In the embodiment, a shape of the substrate 10 in planar view is a rectangular shape. However, the shape of the substrate 10 in planar view is not limited to a rectangular shape, but may be any other shape such as a square, a circle or an ellipse.

The display area DA includes a plurality of pixels PX arrayed in a matrix in the first direction X and the second direction Y. Each of the pixels PX includes a plurality of sub-pixels SP. For example, the pixel PX comprises a red sub-pixel SP1, a green sub-pixel SP2, and a blue sub-pixel SP3. The pixel PX may include sub-pixels SP of other colors such as a white color together with the sub-pixels SP1, SP2, and SP3 or instead of any of the sub-pixels SP1, SP2, and SP3.

The sub-pixel SP comprises a pixel circuit 1 and a display element 20 driven by the pixel circuit 1. The pixel circuit 1 comprises a pixel switch 2, a drive transistor 3, and a capacitor 4. The pixel switch 2 and the drive transistor 3 are, for example, switching elements constituted by thin-film transistors.

A gate electrode of the pixel switch 2 is connected to a scanning line GL. One of a source electrode and a drain electrode of the pixel switch 2 is connected to a signal line SL, and the other is connected to a gate electrode of the drive transistor 3 and the capacitor 4. In the drive transistor 3, one of the source electrode and the drain electrode is connected to the power line PL and the capacitor 4, and the other is connected to a display element 20.

The configuration of the pixel circuit 1 is not limited to the example shown in the figure. For example, the pixel circuit 1 may comprise more thin-film transistors and capacitors.

The display element 20 is an organic light-emitting diode (OLED) serving as a light emitting element. For example, the sub-pixel SP1 comprises a display element 20 that emits light of a red wavelength range, the sub-pixels SP2 comprises a display element 20 that emits light of a green wavelength range, and the sub-pixels SP3 comprises a display element 20 that emits light of a blue wavelength range.

FIG. 2 is a view showing an example of a layout of sub-pixels SP1, SP2, and SP3. In the example of FIG. 2, the sub-pixels SP1 and SP2 are arranged in the second direction Y. Furthermore, each of the sub-pixels P1 and P2 is arranged with the sub-pixels SP3 in the first direction X.

When the sub-pixels SP1, SP2, and SP3 are arranged in such a layout, a row in which the sub-pixels SP1 and SP2 are alternately arranged in the second direction Y and a row in which a plurality of sub-pixels SP3 are repeatedly arranged in the second direction Y are formed in the display area DA. These rows are alternately arranged in the first direction X.

The layout of the sub-pixels SP1, SP2, and SP3 is not limited to the example in FIG. 2. As another example, the sub-pixels SP1, SP2, and SP3 in each pixel PX may be arranged in order in the first direction X.

A rib 5 and a partition 6 are arranged in the display area DA. The rib 5 includes apertures AP1, AP2, and AP3 in the sub-pixels SP1, SP2, and SP3, respectively. In the example shown in FIG. 2, the aperture AP2 is larger than the aperture AP1, and the aperture AP3 is larger than the aperture AP2.

The partition 6 is arranged at a boundary of adjacent sub-pixels SP and overlaps with the rib 5 in planar view. The partition 6 includes a plurality of first partitions 6x extending in the first direction X and a plurality of second partitions 6y extending in the second direction Y. The plurality of first partitions 6x are arranged between the apertures AP1 and AP2 adjacent in the second direction Y and between two apertures AP3 adjacent in the second direction Y. The second partitions 6y are arranged between the apertures AP1 and AP3 adjacent in the first direction X and between the apertures AP2 and AP3 adjacent in the first direction X.

In the example in FIG. 2, the first partitions 6x and the second partitions 6y are connected to each other. Thus, the partition 6 has a grating pattern surrounding the apertures AP1, AP2, and AP3 as a whole. The partition 6 is considered to include apertures at the sub-pixels SP1, SP2, and SP3, similarly to the rib 5.

The sub-pixel SP1 comprises a lower electrode LE1, an upper electrode UE1, and an organic layer OR1 each overlapping with the aperture AP1. The sub-pixel SP2 comprises a lower electrode LE2, an upper electrode UE2, and an organic layer OR2 each overlapping with the aperture AP2. The sub-pixel SP3 comprises a lower electrode LE3, an upper electrode UE3, and an organic layer OR3 each overlapping with the aperture AP3. In the example shown in FIG. 2, outer shapes of the upper electrode UE1 and the organic layer OR1 correspond to each other, outer shapes of the upper electrode UE2 and the organic layer OR2 correspond to each other, and outer shapes of the upper electrode UE3 and the organic layer OR3 correspond to each other.

The lower electrode LE1, the upper electrode UE1, and the organic layer OR1 constitute the display element 20 of the sub-pixel SP1. The lower electrode LE2, the upper electrode UE2, and the organic layer OR 2 constitute the display element 20 of the sub-pixel SP2. The lower electrode LE3, the upper electrode UE3, and the organic layer OR3 constitute the display element 20 of the sub-pixel SP3.

The lower electrode LE1 is connected to the pixel circuit 1 of the sub-pixel SP1 (see FIG. 1) through a contact hole CH1. The lower electrode LE2 is connected to the pixel circuit 1 of the sub-pixel SP2 through a contact hole CH2. The lower electrode LE3 is connected to the pixel circuit 1 of the sub-pixel SP3 through the contact hole CH3.

In the example of FIG. 2, the contact holes CH1 and CH2 entirely overlap with the first partition 6x between the apertures AP1 and AP2 adjacent in the second direction Y. The contact hole CH3 entirely overlaps with the first partition 6x between two apertures AP3 adjacent in the second direction Y. As the other example, at least parts of the contact holes CH1, CH2, and CH3 may not overlap with the first partition 6x.

In the example in FIG. 2, the lower electrodes LE1 and LE2 include protrusions PR1 and PR2, respectively. The protrusion PR1 protrudes from a main body of the lower electrode LE1 (portion overlapping with the aperture AP1) toward the contact hole CH1. The protrusion PR2 protrudes from a main body of the lower electrode LE2 (portion overlapping with the aperture AP2) toward the contact hole CH2. The contact holes CH1 and CH2 overlap with the protrusions PR1 and PR2, respectively.

Figure 3:
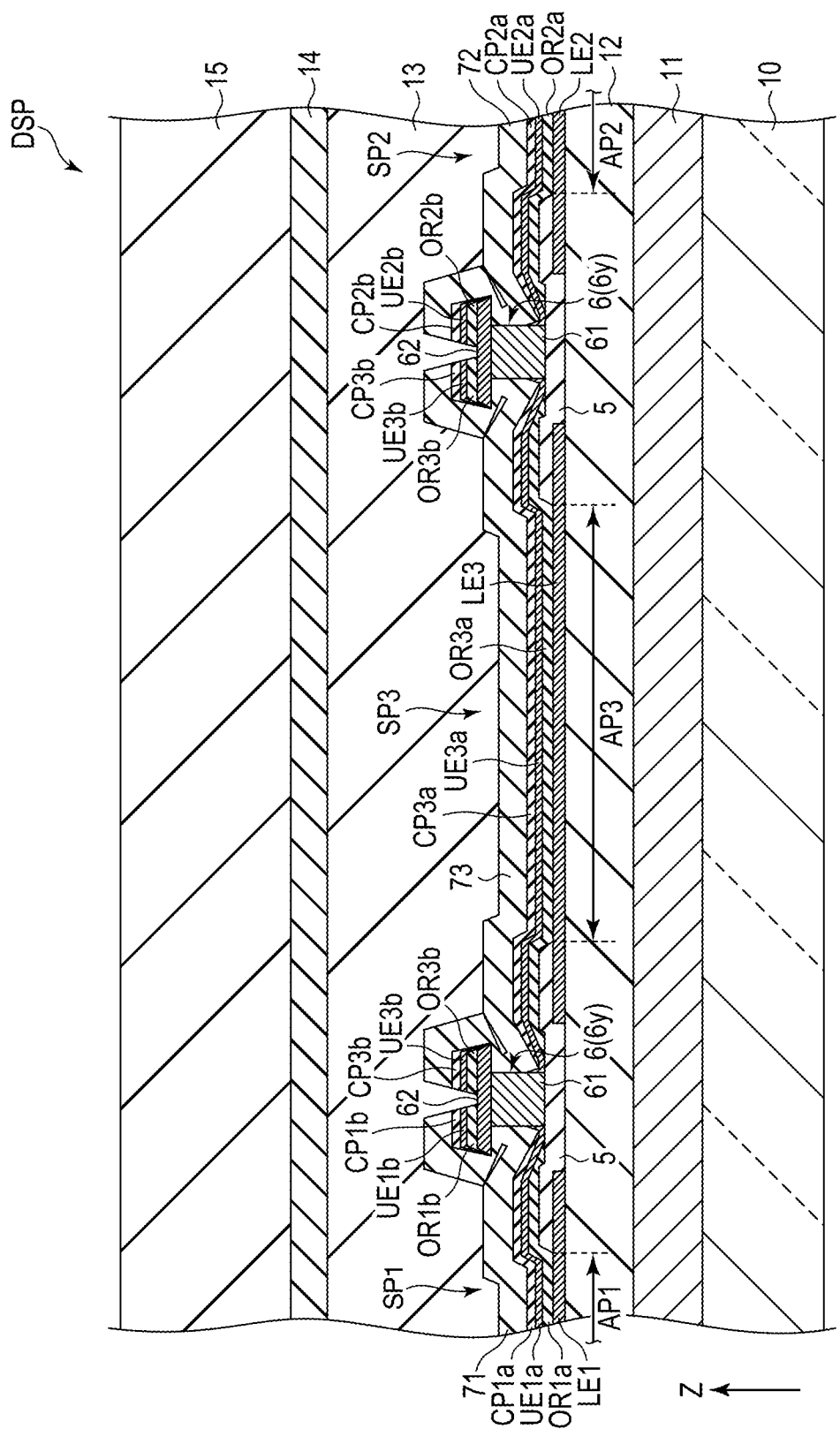
FIG. 3 is a schematic cross-sectional view showing the display device taken along line III-III in FIG. 2.

FIG. 3 is a schematic cross-sectional view showing the display device DSP taken along line III-III in FIG. 2. A circuit layer 11 is arranged on the substrate 10 described above. The circuit layer 11 includes various circuits and lines such as the pixel circuits 1, the scanning lines GL, the signal lines SL and the power lines PL shown in FIG. 1. The circuit layer 11 is covered with an insulating layer 12. The insulating layer 12 functions as a planarization film for planarizing uneven parts generated by the circuit layer 11. Although not shown in the cross section of FIG. 3, the contact holes CH1, CH2, and CH3 are provided in the insulating layer 12.

The lower electrodes LE1, LE2, and LE3 are arranged on the insulating layer 12. The rib 5 is arranged on the insulating layer 12 and the lower electrodes LE1, LE 2, and LE3. End parts of the lower electrodes LE1, LE2, and LE3 are covered with the rib 5.

The partition 6 includes a lower portion 61 arranged on the rib 5 and an upper portion 62 that covers an upper surface of the lower portion 61. The upper portion 62 has a width greater than the lower portion 61. As a result, both the end parts of the upper 62 protrude further than the side surfaces of the lower portion 61 in FIG. 3. This shape of the partition 6 is referred to as overhanging.

The organic layer OR1 shown in FIG. 2 includes a first organic layer OR1a and a second organic layer OR1b that are separated from each other. In addition, the upper electrode UE1 shown in FIG. 2 includes a first upper electrode UE1a and a second upper electrode UE1b that are separated from each other. As shown in FIG. 3, the first organic layer OR1a is brought into contact with the lower electrode LE1 through the aperture AP1 and covers a part of rib 5. The second organic layer OR1b is located on the upper portion 62. The first upper electrode UE1a is opposed to the lower electrode LE1 and covers the first organic layer OR1a. Furthermore, the first upper electrode UE1a is in contact with the side surface of the lower portion 61. The second upper electrode UE1b is located above this partition 6 and covers the second organic layer OR1b.

The organic layer OR2 shown in FIG. 2 includes a first organic layer OR2a and a second organic layer OR2b that are separated from each other. In addition, the upper electrode UE2 shown in FIG. 2 includes a first upper electrode UE2a and a second upper electrode UE2b that are separated from each other. As shown in FIG. 3, the first organic layer OR2a is brought into contact with the lower electrode LE2 through the aperture AP2 and covers a part of the rib 5. The second organic layer OR2b is located on the upper portion 62. The first upper electrode UE2a is opposed to the lower electrode LE2 and covers the first organic layer OR2a. Furthermore, the first upper electrode UE2a is in contact with the side surface of the lower portion 61. The second upper electrode UE2b is located above the partition 6 and covers the second organic layer OR2b.

The organic layer OR3 shown in FIG. 2 includes a first organic layer OR3a and a second organic layer OR3b that are separated from each other. In addition, the upper electrode UE3 shown in FIG. 2 includes a first upper electrode UE3a and a second upper electrode UE3b that are separated from each other. As shown in FIG. 3, the first organic layer OR3a is brought into contact with the lower electrode LE3 through the aperture AP3 and covers a part of the rib 5. The second organic layer OR3b is located on the upper portion 62. The first upper electrode UE3a is opposed to the lower electrode LE3 and covers the first organic layer OR3a. Furthermore, the first upper electrode UE3a is in contact with the side surface of the lower portion 61. The second upper electrode UE3b is located above the partition 6 and covers the second organic layer OR3b.

In the example of FIG. 3, the sub-pixels SP1, SP2, and SP3 include cap layers CP1, CP2, and CP3 for adjusting the optical characteristics of the light emitted from the emitting layers of the organic layers OR1, OR2, and OR3.

The cap layer CP1 includes a first cap layer CP1a and a second cap layer CP1b that are separated from each other. The first cap layer CP1a is located at the aperture AP1 and arranged on the first upper electrode UE1a. The second cap layer CP1b is located above the partition 6 and arranged on the second upper electrode UE1b.

The cap layer CP2 includes a first cap layer CP2a and a second cap layer CP2b that are separated from each other. The first cap layer CP2a is located at the aperture AP2 and arranged on the first upper electrode UE2a. The second cap layer CP2b is located above the partition 6 and arranged on the second upper electrode UE2b.

The cap layer CP3 includes a first cap layer CP3a and a second cap layer CP3b that are separated from each other. The first cap layer CP3a is located at the aperture AP3 and arranged on the first upper electrode UE3a. The second cap layer CP3b is located above the partition 6 and arranged on the second upper electrode UE3b.

Sealing layers 71, 72, and 73 are arranged in the sub-pixels SP1, SP2, and SP3, respectively. The sealing layer 71 continuously covers members of the sub-pixel SP1 including the first cap layer CP1a, the partition 6, and the second cap layer CP1b. The sealing layer 72 continuously covers members of the sub-pixel SP2 including the first cap layer CP2a, the partition 6, and the second cap layer CP2b. The sealing layer 73 continuously covers members of the sub-pixel SP3 including the first cap layer CP3a, the partition 6, and the second cap layer CP3b.

In the example in FIG. 3, the second organic layer OR1b, the second upper electrode UE1b, the second cap layer CP1b, and the sealing layer 71 on the partition 6 between the sub-pixels SP1 and SP3 are separated from the second organic layer OR3b, the second upper electrode UE3b, the second cap layer CP3b, and the sealing layer 73 on the partition 6. In addition, the second organic layer OR2b, the second upper electrode UE2b, the second cap layer CP2b, and the sealing layer 72 on the partition 6 between the sub-pixels SP1 and SP3 are separated from the second organic layer OR3b, the second upper electrode UE3b, the second cap layer CP3b, and the sealing layer 73 on the partition 6.

The sealing layers 71, 72, and 73 are covered with a resin layer 13. The resin layer 13 is covered with a sealing layer 14. Furthermore, the sealing layer 14 is covered with a resin layer 15.

The insulating layer 12 and the resin layers 13 and 15 are formed of an organic material. The rib 5 and the sealing layers 14, 71, 72, and 73 are formed of, for example, an inorganic material such as silicon nitride (SiNx).

The lower portion 61 of the partition 6 is conductive. The upper portion 62 of the partition 6 may also be conductive. The lower electrodes LE1, LE2, and LE3 may be formed of a transparent conductive oxide such as indium tin oxide (ITO) or may have a multilayer structure of a metallic material such as silver (Ag) and a conductive oxide. The upper electrodes UE1, UE2, and UE3 are formed of, for example, a metallic material such as an alloy (MgAg) of magnesium and silver. The upper electrodes UE1, UE2, and UE3 may be formed of a conductive oxide such as ITO.

When potentials of the lower electrodes LE1, LE2, and LE3 are relatively higher than those of the upper electrodes UE1, UE2, and UE3, the lower electrodes LE1, LE2, and LE3 correspond to anodes, and the upper electrodes UE1, UE2, and UE3 correspond to cathodes. In addition, when the potentials of the upper electrodes UE1, UE2, and UE3 are relatively higher than those of the lower electrodes LE1, LE2, and LE3, the upper electrodes UE1, UE2, and UE3 correspond to anodes, and the lower electrodes LE1, LE2, and LE3 correspond to cathodes.

The organic layers OR1, OR2, and OR3 include a pair of functional layers and a light emitting layer interposed between these functional layers. As an example, each of the organic layers OR1, OR2, and OR3 includes a structure in which a hole-injection layer, a hole-transport layer, an electron blocking layer, an emitting layer, a hole blocking layer, an electron-transport layer, and an electron-injection layer are stacked in this order.

The cap layers CP1, CP2, and CP3 are formed of, for example, multilayer bodies of a plurality of transparent thin films. The multilayer body may include a thin film formed of an inorganic material and a thin film formed of an organic material, as the plurality of thin films. In addition, the plurality of thin films have refractive indexes different from one another. The materials of the thin films constituting the multilayer body are different from the materials of the upper electrodes UE1, UE2, and UE3 and different from the materials of the sealing layers 71, 72, and 73. The cap layers CP1, CP2, and CP3 may be omitted.

A common voltage is supplied to the partition 6. This common voltage is supplied to each of the first upper electrodes UE1a, UE2a, and UE3a that are in contact with the side surfaces of the lower portion 61. A pixel voltage is supplied to the lower electrodes LE1, LE2, and LE3 through the pixel circuits 1 included in the respective sub-pixels SP1, SP2, and SP3.

When a potential difference is formed between the lower electrode LE1 and the upper electrode UE1, the emitting layer of the first organic layer OR1a emits light of the red wavelength range. When a potential difference is formed between the lower electrode LE2 and the upper electrode UE2, the emitting layer of the first organic layer OR2a emits light of the green wavelength range. When a potential difference is formed between the lower electrode LE3 and the upper electrode UE3, the emitting layer of the first organic layer OR3a emits light of the blue wavelength range.

As another example, the emitting layers of the organic layers OR1, OR2, and OR3 may emit light of the same color (for example, white). In this case, the display device DSP may comprise color filters that convert the light emitted from the emitting layers into light of the colors corresponding to the sub-pixels SP1, SP2, and SP3. In addition, the display device DSP may comprise color filters that are excited by the light emitted from the emitting layers and generate the light of the colors corresponding to the sub-pixels SP1, SP2, and SP3.

FIG. 4 is a schematic, enlarged cross-sectional view showing the partition 6. In this figure, elements other than the rib 5, the partition 6, the insulating layer 12, and a pair of lower electrodes LE are omitted. The pair of lower electrodes LE correspond to any of the above-described lower electrodes LE1, LE2, and LE3. The first partition 6x and the second partition 6y described above have the same structure as the partition 6 shown in FIG. 4.

In the example of FIG. 4, the lower portion 61 of the partition 6 includes a barrier layer 600 arranged on the rib 5 and a metal layer 610 arranged on the barrier layer 600. The barrier layer 600 is formed of, for example, molybdenum (Mo). The metal layer 610 contains, for example, aluminum (Al) and is formed to be thicker than the barrier layer 600. In the embodiment, the metal layer 610 is formed of pure aluminum. As an example, the barrier layer 600 has a thickness of 100 nm or less and the metal layer 610 has a thickness of 500 nm or more.

The upper portion 62 is thinner than the lower portion 61. In the example of FIG. 4, the upper portion 62 includes a first layer 621 arranged on the metal layer 610 and a second layer 622 arranged on the first layer 621. For example, the first layer 621 is formed of a metal such as titanium (Ti) and the second layer 622 is formed of a conductive oxide such as ITO, but are not limited to this example. The upper portion 62 may be a single-layer body or a stacked layer body of three or more layers.

In the example of FIG. 4, the width of the lower portion 61 becomes smaller toward the upper portion 62. In other words, side surfaces 61a and 61b of the lower portion 61 are inclined to the third direction Z. The upper portion 62 includes an end portion 62a protruding from the side surface 61a and an end portion 62b protruding from the side surface 61b.

An amount of protrusion D of the end portions 62a and 62b from the side surfaces 61a and 61b is, for example, 2.0 μm or less. The amount of protrusion D corresponds to a distance from lower ends of the side surfaces 61a and 61b to the end portions 62a and 62b in the width direction (first direction X or second direction Y) of the partition 6.

Next, a method of manufacturing the display device DSP will be described.

FIG. 5 to FIG. 9 are schematic cross-sectional views showing parts of the method of manufacturing the display device DSP. First, as shown in FIG. 5, the circuit layer 11, the insulating layer 12, the lower electrode LE, and the rib 5 are formed in this order above substrate 10.

Next, as shown in FIG. 6, a barrier layer 600a covering the rib 5 and the lower electrodes LE is formed, a metal layer 610a is formed on the barrier layer 600a, a first layer 621a is formed on the metal layer 610a, and a second layer 622a is formed on the first layer 621a. Sputtering can be applied to the formation of the barrier layer 600a, the metal layer 610a, the first layer 621a, and the second layer 622a.

Furthermore, as shown in FIG. 6, a resist R is formed on the second layer 622a. The resist R is patterned in the same shape as the partition 6 in planar view.

Next, as shown in FIG. 7, etching is performed using the resist R as a mask such that a portion of the second layer 622a which is exposed from the resist R is removed. The second layer 622 having the shape shown in FIG. 4 is thereby formed. In the following descriptions, a portion of the metal layer 610a which is exposed from the resist R and the second layer 622 (i.e., a portion which does not overlap in the third direction Z) is referred to as a first portion P1. In addition, a portion of the metal layer 610a which is located under the resist R and the second layer 622 is referred to as a second portion P2.

In the embodiment, two types of etching are performed for the metal layer 610a to form the metal layer 610 having the shape shown in FIG. 4. More specifically, anisotropic dry etching shown in FIG. 8 and isotropic wet etching shown in FIG. 9 are performed.

Figure 8:
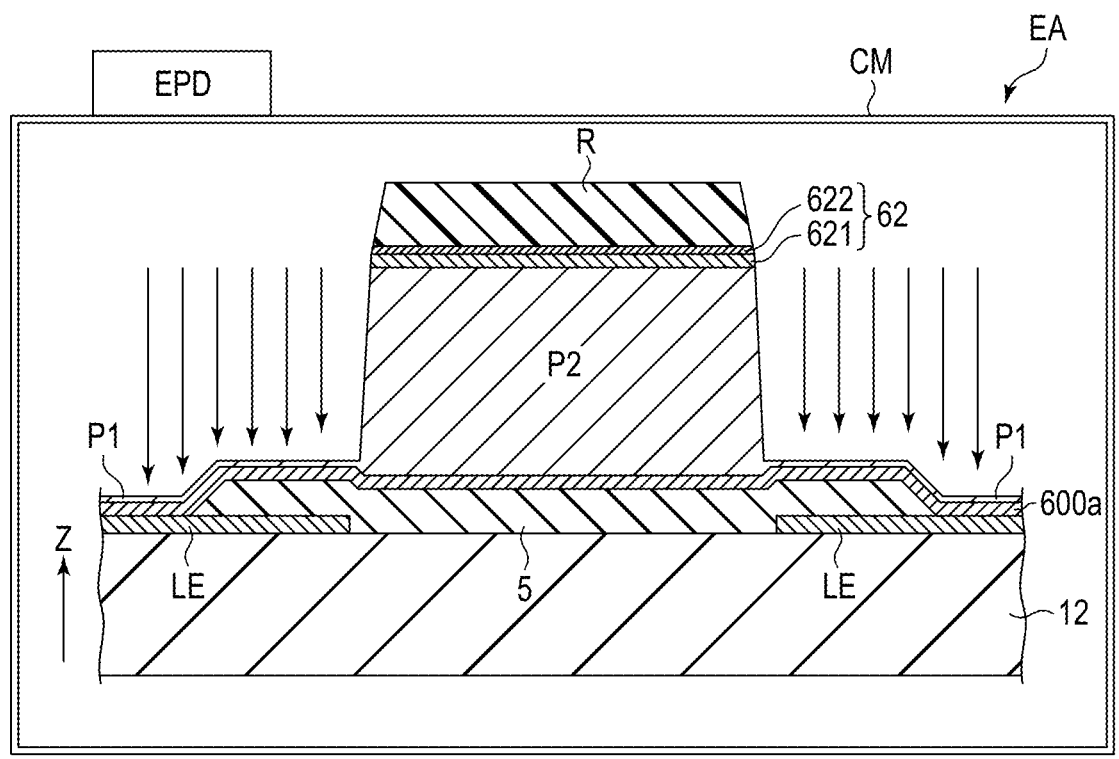
FIG. 8 is a schematic cross-sectional view showing a manufacturing process following FIG. 7.
Figure 9:
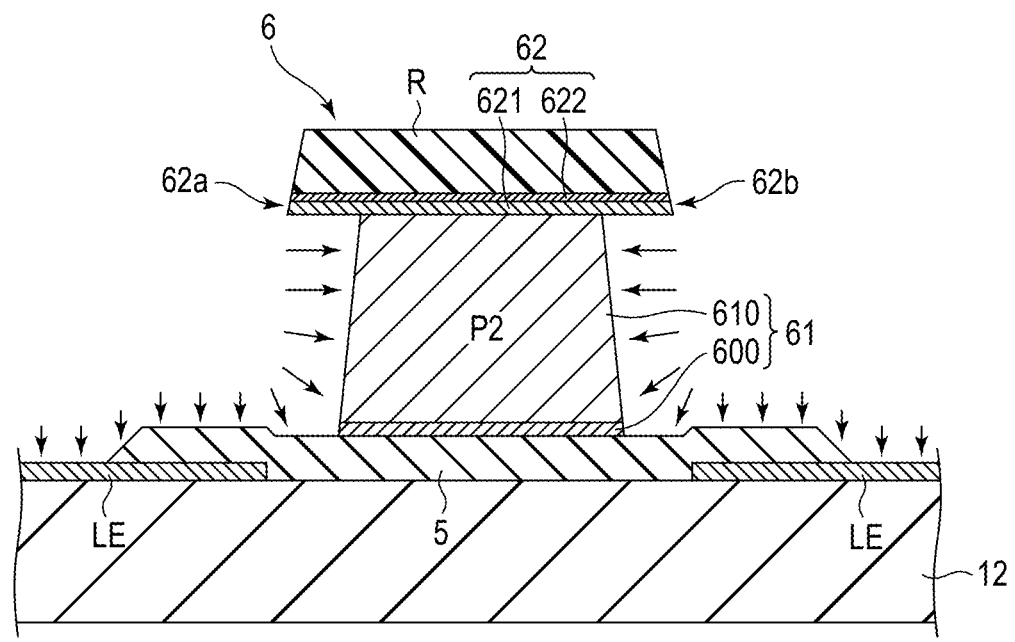
FIG. 9 is a schematic cross-sectional view showing a manufacturing process following FIG. 8.

As shown in FIG. 8, the substrate subjected to the process of FIG. 7 is arranged inside a chamber CM of an etching device EA and a portion of the first layer 621a which is exposed from the resist R and the second layer 622 is removed, in the anisotropic dry etching. The upper portion 62 including the first layer 621 and the second layer 622 having the shape shown in FIG. 4 is thereby formed.

Furthermore, the thickness of the first portion P1 is reduced in the anisotropic dry etching. The first portion P1 may be completely removed but, in this case, contamination resulting from the barrier layer 600a may be generated in the chamber CM. For this reason, the anisotropic dry etching is desirably stopped in a state in which the first portion P1 is partially left. In the anisotropic dry etching, the second portion P2 located under the resist R is hardly erased.

The timing at which the etching device EA stops the anisotropic dry etching can be controlled using, for example, an end point detector EPD. Although described later in more detail, the end point detector EPD detects an end point at which the etching is to be stopped, based on spectrum of plasma generated in the chamber CM during the anisotropic dry etching.

In the isotropic wet etching, as shown in FIG. 9, the part of the first portion P1 left in the anisotropic dry etching and the barrier layer 600a under the left part are removed.

Furthermore, the width of the second portion P2 is reduced by removing parts of the second portion P2 which are located under the end portions 62a and 62b of the upper portion 62. The lower portion 61 including the barrier layer 600 and the metal layer 610 having the shape shown in FIG. 4 is thereby formed.

The amount of reducing the width of the second portion P2 by the isotropic wet etching can be varied in accordance with the shape obtained for the partition 6. As an example, the width of the second portion P2 is reduced such that the above-described amount of protrusion D is 2.0 µm or less, in the isotropic wet etching.

After the partition 6 is completed through the processes of FIG. 5 to FIG. 9, the resist R is removed. Furthermore, the organic layers OR1, OR2, and OR3, the upper electrodes UE1, UE2, and UE3, the cap layers CP1, CP2, and CP3, the sealing layers 71, 72, and 73, the resin layer 13, the sealing layer 14, and the resin layer 15 are formed, and the display device DSP shown in FIG. 3 is completed.

The organic layer OR1, the upper electrode UE1, the cap layer CP1, and the sealing layer 71 arranged in the sub-pixel SP1 are formed on the entire substrate by vapor deposition. At this time, the organic layer OR1 is divided into the first organic layer OR1a and the second organic layer OR1b, the upper electrode UE1 is divided into the first upper electrode UE1a and the second upper electrode UE1b, and the cap layer CP1 is divided into the first cap layer CP1a and the second cap layer CP1b, by the overhanging partition 6. After that, parts of the organic layer OR1, the upper electrode UE1, the cap layer CP1, and the sealing layer 71, which are located in the sub-pixels SP2 and SP3, are removed. The organic layers OR2 and OR3, the upper electrodes UE2 and UE3, the cap layers CP2 and CP3, and the sealing layers 72 and 73 can also be formed in the same manner.

A concrete example of control of the timing of stopping the anisotropic dry etching as described with reference to FIG. 8 will be described.

FIG. 10 is a graph showing an example of plasma illumination intensity detected by the end point detector EPD in the anisotropic dry etching. A curve L1 refers to a chronological variation in emission intensity of the spectrum corresponding to the metal layer 610 or the spectrum corresponding to aluminum in the embodiment. In addition, a curve L2 refers to a variation amount of the curve L1.

As represented by the curve L1, emission intensity is increased when etching the metal layer 610 is started, the emission intensity is stable while the metal layer 610 is gradually erased, and the emission intensity is lowered when the metal layer 610 becomes sufficiently thin. For example, the emission intensity of the spectrum corresponding to the metal layer 610 is lowered due to reduction in thickness of the metal layer 610 and, accordingly, the end point detector EPD detects the end point.

More specifically, after detection of the emission intensity is started and a delay time DT elapses, the variation amount indicated by the curve L2 is varied to be higher than equal to a threshold value SH and, accordingly, the end point detector EPD detects the end point (EP). The delay time DT excludes the variation in emission intensity at the start of etching from monitoring targets for detection of the end point and is predetermined.

A manner of detecting the end point based on the plasma spectrum is not limited to the manner exemplified above. For example, the end point detector EPD may detect the end point based on not the variation amount indicated by the curve L2, but comparison between the emission intensity indicated by the curve L1 and the threshold value.

The etching device EA may stop the anisotropic dry etching at the time when the end point is detected or when a certain time has elapsed after the end point is detected. By thus detecting the end point and stopping the anisotropic dry etching, next isotropic wet etching can be performed in a state in which the thickness of the first portion P1 of the metal layer 610a is reduced to a desired thickness.

In the above embodiment, the anisotropic dry etching is first performed and then the isotropic wet etching is performed when the overhanging partition 6 is formed. If the partition 6 is formed by not performing the anisotropic dry etching but performing the only isotropic wet etching, the width of the second portion P2 may be remarkably reduced before the first portion P1 is removed, and the amount of protrusion D of the upper portion 62 may become excessive. When the amount of protrusion D becomes excessive, portions where the upper electrodes UE1, UE2, and UE3 are not in contact with the lower portion 61 may occur.

In contrast, according to the manufacturing method of the embodiment, the time of the isotropic wet etching for the second portion P2 can be reduced since the isotropic wet etching is performed in a state in which the thickness of the first portion P1 is reduced by the anisotropic dry etching. As a result, the partition 6 in which the amount of protrusion D of the upper portion 62 falls within a desirable range (for example, 2.0 µm or less) can be formed with a high accuracy.

As described above, the accuracy of etching can be further enhanced and the yield of the display device DSP can be improved by stopping the anisotropic dry etching in accordance with detection of the end point.

Second Embodiment

A display device DSP of a second embodiment will be described. Descriptions of the same structure as that of the first embodiment are omitted.

FIG. 11 is a schematic cross-sectional view showing a partition 6 provided in a display device DSP of a second embodiment. Similarly to FIG. 4, elements other than the rib 5, the partition 6, the insulating layer 12, and a pair of lower electrodes LE are omitted.

In the example of FIG. 11, a metal layer 610 of a lower portion 61 includes a first aluminum layer 611 arranged on a barrier layer 600, and a second aluminum layer 612 arranged on the first aluminum layer 611. Each of the first aluminum layer 611 and the second aluminum layer 612 is formed of, for example, pure aluminum.

In the example of FIG. 11, the second aluminum layer 612 is formed to be thicker than the first aluminum layer 611, but the formation is not limited to this example. An aluminum oxide film 613 is formed on an upper surface of the first aluminum layer 611. The oxide film 613 is covered with the second aluminum layer 612.

FIG. 12 to FIG. 15 are schematic cross-sectional views showing parts of a method of manufacturing the display device DSP. In manufacturing the display device DSP of the embodiment, a circuit layer 11, an insulating layer 12, a lower electrode LE, and a rib 5 are first formed in this order above a substrate 10, similarly to those in FIG. 5.

Next, as shown in FIG. 12, a barrier layer 600a covering the rib 5 and the lower electrodes LE is formed, a first aluminum layer 611a is formed on the barrier layer 600a, and a second aluminum layer 612a is formed on the first aluminum layer 611a. Furthermore, a first layer 621a is formed on the second aluminum layer 612a, a second layer 622a is formed on the first layer 621a, and a resist R is formed on a second layer 622a. Sputtering can be applied to the formation of the barrier layer 600a, the first aluminum layer 611a, the second aluminum layer 612a, the first layer 621a, and the second layer 622a.

For example, after the first aluminum layer 611a is formed, an oxide film 613 is formed on an upper surface of the first aluminum layer 611a by cooling the substrate in air before forming the second aluminum layer 612a.

Next, as shown in FIG. 13, etching is performed using the resist R as a mask such that a portion of the second layer 622a which is exposed from the resist R is removed. The second layer 622 is thereby formed. In the following descriptions, a portion of the first aluminum layer 611a and the second aluminum layer 612a, which is exposed from the resist R and the second layer 622 (i.e., a portion which does not overlap in the third direction Z), is referred to as a first portion P1. In addition, a portion of the first aluminum layer 611a and the second aluminum layer 612a, which is located under the resist R and the second layer 622, is referred to as a second portion P2.

In the embodiment, too, the anisotropic dry etching shown in FIG. 14 and the isotropic wet etching shown in FIG. 15 are performed for the first aluminum layer 611a and the second aluminum layer 612a.

As shown in FIG. 14, the substrate subjected to the process of FIG. 13 is arranged inside a chamber CM of an etching device EA and a portion of the first layer 621a which is exposed from the resist R and the second layer 622 is removed, in the anisotropic dry etching. An upper portion 62 including the first layer 621 and the second layer 622 is thereby formed.

Furthermore, the thickness of the first portion P1 is reduced in the anisotropic dry etching. The etching device EA stops the anisotropic dry etching in a state in which the second aluminum layer 612a included in the first portion P1 is entirely removed and the first aluminum layer 611a included in the first portion P1 partially remains.

After that, in the isotropic wet etching, the remaining part of the first aluminum layer 611a included in the first portion P1 and the barrier layer 600a under the part are removed as shown in FIG. 15. Furthermore, the width of the second portion P2 is reduced by removing parts of the second portion P2 which are located under the end portions 62a and 62b of the upper portion 62. The lower portion 61 including the barrier layer 600 and the metal layer 610 is thereby formed.

After the partition 6 is completed through the processes of FIG. 12 to FIG. 15, the resist R is removed. Furthermore, the organic layers OR1, OR2, and OR3, the upper electrodes UE1, UE2, and UE3, the cap layers CP1, CP2, and CP3, the sealing layers 71, 72, and 73, the resin layer 13, the sealing layer 14, and the resin layer 15 are formed, and the display device DSP is completed.

A concrete example of control of the timing of stopping the anisotropic dry etching in the embodiment will be described.

FIG. 16 is a graph showing an example of emission intensity of plasma detected by the end point detector EPD in the anisotropic dry etching. Similarly to the example of FIG. 10, a curve L1 refers to a chronological variation in emission intensity of the spectrum corresponding to the metal layer 610 (aluminum), and a curve L2 refers to a variation amount of the curve L1.

The emission intensity of the plasma is lowered when the oxide film 613 of the first aluminum layer 611 is etched, as indicated by a part surrounded by broken line A. In the embodiment, the end point is detected using the variation in emission intensity.

In the embodiment, a delay time DT is set to arrive after the emission intensity is varied at the start of etching and before the variation in emission intensity as surrounded by broken line frame A occurs. After the delay time DT elapses, the variation in emission intensity which results from the oxide film 613 is detected as the end point (EP) based on, for example, comparison between the variation amount indicated by the curve L2 and a threshold value SH. The end point may be detected based on comparison between the emission intensity indicated by the curve L1 and the threshold value.

The etching device EA may stop the anisotropic dry etching at the time when the end point is detected or when a certain time has elapsed after the end point is detected. In the example of FIG. 14, even after the oxide film 613 of the first portion P1 is removed, the anisotropic dry etching is continued until the thickness of the first aluminum layer 611a of the first portion P1 is reduced to some extent.

Thus, the end point can be detected in the middle of the metal layer 610, in the configuration of the embodiment. For this reason, the timing of stopping the anisotropic dry etching can be controlled further accurately.

In addition, the metal layer 610 cannot be formed to be sufficiently thick due to restrictions of the manufacturing device. For this reason, even if the lower portion 61 of the partition 6 needs to be formed to be high, its implementation may be difficult. In contrast, in the embodiment, since the first aluminum layer 611 and the second aluminum layer 612 of the metal layer 610 can be formed separately, the partition 6 having a sufficient height can be formed. In addition, the same advantages as those of the first embodiment can be obtained from the embodiment.

All of the display devices and manufacturing methods that can be implemented by a person of ordinary skill in the art through arbitrary design changes to the display devices and manufacturing methods described above as embodiments of the present invention come within the scope of the present invention as long as they are in keeping with the spirit of the present invention.

Various types of the modified examples are easily conceivable within the category of the ideas of the present invention by a person of ordinary skill in the art and the modified examples are also considered to fall within the scope of the present invention. For example, the above embodiments with addition, deletion, and/or designed change of their structural elements by a person having ordinary skill in the art, or the above embodiments with addition, omission, and/or condition change of their processes by a person having ordinary skill in the art are encompassed by the scope of the present inventions without departing the spirit of the inventions.

In addition, the other advantages of the aspects described in the embodiments, which are obvious from the descriptions of the present specification or which can be arbitrarily conceived by a person of ordinary skill in the art, are considered to be achievable by the present invention as a matter of course.

What is claimed is:

1. A method of manufacturing a display device in which a partition including a lower portion and an upper portion arranged on the lower portion to protrude from a side surface of the lower portion is arranged on a boundary between adjacent sub-pixels, the method comprising:
forming a metal layer above a substrate;
forming the upper portion on the metal layer;
reducing a thickness of a first portion of the metal layer exposed from the upper portion by anisotropic etching;

forming the lower portion by reducing a width of a second portion of the metal layer located under the upper portion by isotropic etching; and stopping the anisotropic etching while leaving a part of the first portion, and removing the part by the isotropic etching.

2. The method of claim 1, comprising:

detecting an end point predetermined based on a spectrum of plasma generated in the anisotropic etching; and stopping the anisotropic etching in accordance with the detection of the end point.

3. The method of claim 2, comprising:

detecting the end point in accordance with an emission intensity of the spectrum corresponding to the metal layer of the plasma, which is varied by reducing a thickness of the metal layer.

4. The method of claim 1, wherein the metal layer contains aluminum.

5. The method of claim 1, wherein the metal layer includes a first aluminum layer and a second aluminum layer arranged on the first aluminum layer, and the method comprises:

stopping the anisotropic etching in a state in which the second aluminum layer included in the first portion is entirely removed and a part of the first aluminum layer included in the first portion remains; and removing the remaining part of the first aluminum layer by the isotropic etching.

6. The method of claim 5, wherein an oxide film is formed on an upper surface of the first aluminum layer, and the oxide film is covered with the second aluminum layer.

7. The method of claim 6, comprising:

detecting an end point predetermined based on a spectrum of plasma generated in the anisotropic etching; and stopping the anisotropic etching in accordance with the detection of the end point.

8. The method of claim 7, comprising:

detecting the end point in accordance with an emission intensity of the spectrum, which is varied by the oxide film.

9. The method of claim 1, comprising:

reducing a width of the second portion in the isotropic etching such that an amount of protrusion of the upper portion from a side surface of the lower portion is 2.0 µm or less.

10. The method of claim 1, comprising:

forming a first layer on the metal layer;

forming a second layer on the first layer;

forming a resist on the second layer; and removing a part of the second layer which is exposed from the resist, by etching using the resist as a mask, removing a part of the first layer which is exposed from the resist, by the anisotropic etching, and thereby forming the upper portion including the first layer and the second layer.

11. The method of claim 1, comprising:

forming a lower electrode in the sub-pixel;

forming an organic layer covering the lower electrode; and forming an upper electrode which covers the organic layer and is in contact with the lower portion.

* * * * *